(12) United States Patent
Hsu

(10) Patent No.: US 9,941,208 B1
(45) Date of Patent: Apr. 10, 2018

(54) SUBSTRATE STRUCTURE AND MANUFACTURING METHOD THEREOF

(71) Applicant: Phoenix Pioneer Technology Co., Ltd., Hsinchu County (TW)

(72) Inventor: Shih-Ping Hsu, Hsinchu County (TW)

(73) Assignee: PHOENIX & CORPORATION, Grand Cayman (KY)

( * ) Notice: Subject to any disclaimer, the term of this patent is extended or adjusted under 35 U.S.C. 154(b) by 0 days.

(21) Appl. No.: 15/390,892

(22) Filed: Dec. 27, 2016

(30) Foreign Application Priority Data

Sep. 20, 2016 (TW) .............................. 105130268 A

(51) Int. Cl.
| | | |
|---|---|---|
| *H01L 23/02* | (2006.01) | |
| *H01L 23/06* | (2006.01) | |
| *H01L 23/34* | (2006.01) | |
| *H01L 21/44* | (2006.01) | |
| *H01L 21/50* | (2006.01) | |
| *H01L 23/528* | (2006.01) | |
| *H01L 23/532* | (2006.01) | |
| *H01L 21/768* | (2006.01) | |

(52) U.S. Cl.
CPC ...... *H01L 23/528* (2013.01); *H01L 21/76885* (2013.01); *H01L 23/53228* (2013.01)

(58) Field of Classification Search
CPC ......... H01L 21/52; H01L 21/71; H01L 21/77; H01L 25/062; H01L 25/0655; H01L 25/071; H01L 25/072; H01L 25/073; H01L 25/165; H01L 29/0684; H01L 29/41; H01L 23/043; H01L 23/051; H01L 23/06; H01L 23/10; H01L 23/142; H01L 23/16; H01L 23/42
USPC ........ 438/107, 109, 125, 127; 257/678, 680, 257/684, 686, 690, 707
See application file for complete search history.

(56) References Cited

U.S. PATENT DOCUMENTS 8,878,221 B2 * 11/2014 Lee ...................... F21S 48/321
257/99

* cited by examiner

*Primary Examiner* — Hsien Ming Lee
(74) *Attorney, Agent, or Firm* — McClure, Qualey & Rodack, LLP

(57) ABSTRACT

A substrate structure includes a metal substrate, a first connection layer, a second connection layer, a dielectric material layer, a metal core layer and an internal component. The first and second connection layers are disposed on a surface of the metal substrate. The metal core layer having an opening is disposed on a surface of the first connection layer. The internal component having a plurality of electrode pads is disposed on a surface of the second connection layer and in the opening of the metal core layer. The dielectric material layer is disposed on the surface of the metal substrate. The first and second connection layers, the metal core layer and the internal component are partially covered with the dielectric material layer. The metal core layer is electrically connected to one of the electrode pads via the first and second connection layers and the metal core layer.

17 Claims, 19 Drawing Sheets

SUBSTRATE STRUCTURE AND MANUFACTURING METHOD THEREOF

CROSS REFERENCE TO RELATED APPLICATIONS

This Non-provisional application claims priority under 35 U.S.C. § 119(a) on Patent Application No. 105130268 filed in Taiwan on Sep. 20, 2016, the entire contents of which are hereby incorporated by reference.

BACKGROUND

1. Technical Field

This invention relates to a substrate structure and a manufacturing method thereof, in particular, to a semiconductor substrate structure and a manufacturing method thereof.

2. Description of Related Art

In recent years, users prefer electronic products with compact size, high performance and versatility. Thus, electronics manufacturers have to accommodate more components in a limited space of an integrated circuit (IC) to achieve high density and miniaturization. As a result, electronics manufacturers advance a new IC package for embedding components in a substrate to reduce the package size and the connection path between the components and the substrate.

A chip scale package (CSP) is a type of integrated circuit package. Originally, the CSP was the acronym for chip-size packaging. Since only a few packages are chip size, the meaning of the acronym was adapted to chip-scale packaging. The CSP is applied with the smart phone, the tablet, the laptop or the miniature camera to operate under high frequency and high speed processing.

In general, the substrate in the CSP is made of fiberglass that is easy to wrap and deformation. In addition, the blind holes of the substrate are used for the different layers to electrically connect to each other that are usually made by laser drilling or mechanical drilling. It is difficult to narrow the aperture of the blind hole by laser drilling or mechanical drilling and cannot achieve the circuit with the fine pitch.

FIG. 15A depicts a conventional package structure 4 using the wire bonding technology. The package structure 4 includes a substrate 41, a chip 42, an electrical conductive layer 43, an electrical conductive wire 45 and a solder ball 46. A first surface of the substrate 41 has at least an electrode pad 411. The electrical conductive layer 43 through the substrate 41 via a through hole so that the both side of the substrate 41 could be electrically connected via the electrical conductive layer 43. The chip 42 is disposed on the first surface of the substrate 41. The electrical conductive wire 45 is electrically connected to the chip 42 and the electrode pad 411. The solder ball 46 is electrically connected to the electrical conductive layer 43 that is disposed on a second surface, which is opposite to the first surface of the substrate 41. It is easy to result drawbacks as mentioned above due to the material of the substrate 41 is most used the fiberglass, and the blind holes are usually made by laser drilling or mechanical drilling.

Moreover, FIG. 15B depicts another conventional package structure 5. The package structure 5 includes a substrate 51, a chip 52, an electrical conductive adhesive layer 53, a dielectric layer 54, a conductive wiring layer 55, a blind hole 56 and a through hole 57. The chip 52 is disposed on a surface of the substrate 51. The dielectric layer 54 has an opening to expose a plurality of electrode pads 521 of the chip 52. The dielectric layer 54 covers a part of the chip 52, the electrical conductive adhesive layer 53 and the exposed surface of the substrate 51. The conductive wiring layer 55 is disposed on a surface of dielectric layer 54, which is far away from the substrate 51. A part of the conductive wiring layer 55 is electrically connected to the electrode pads 521 of the chip 52 via the blind hole 56. The other part of the conductive wiring layer 55 is electrically connected to the electrode pads 521 of the chip 52 via the through hole 57. It is easy to result drawbacks as mentioned above due to the blind hole 56 and the through hole 57 are usually made by laser drilling or mechanical drilling.

Therefore, it is an important subject to provide a substrate structure and its manufacturing method that has the advantage of higher rigidity, higher heat dissipation and meeting the fine line spacing, high-density, thinning tendency, low cost and high electric characteristics.

SUMMARY OF THE INVENTION

In view of the foregoing, the present invention is to provide a substrate structure and its manufacturing method having rigidity and heat dissipation and meeting the fine line spacing, high-density, thinning tendency, low-cost and high electric characteristics.

To achieve the above, the present invention is to provide a substrate structure. The substrate structure comprises a metal substrate, a first connection layer, a metal core layer, a second connection layer, an internal component and a dielectric material layer. The metal core layer having an opening is disposed on a first surface of the first connection layer. The second connection layer is disposed on the first surface of the metal substrate and located in the opening. The internal component having a plurality of electrode pads is disposed on the second connection layer and located in the opening. The dielectric material layer is disposed on the first surface of the metal substrate to partially cover the first and second connection layers, the metal core layer and the internal component. The metal core layer is electrically connected to one of the electrode pads via the metal substrate, the first and the second connection layers.

To achieve the above, the present invention is to provide a manufacturing method of substrate structure. The manufacturing method comprises the steps of: providing a metal substrate; providing an internal component having a plurality of electrode pads; forming a first connection layer and a second connection layer on a first surface of the metal substrate; forming a metal core layer having an opening on the first connection layer; disposing the internal component on the second connection layer and in the opening; forming a dielectric material layer on the first surface of the metal substrate to cover the first connection layer, the metal core layer, the second connection layer and the internal component; and exposing a surface of the metal core layer and a surface of parts of the electrode pads.

The detailed technology and preferred embodiments implemented for the subject invention are described in the following paragraphs accompanying the appended drawings for people skilled in this field to well appreciate the features of the claimed invention.

BRIEF DESCRIPTION OF THE DRAWINGS

The parts in the drawings are not necessarily drawn to scale, the emphasis instead being placed upon clearly illustrating the principles of at least one embodiment. In the drawings, like reference numerals designate corresponding parts throughout the various diagrams, and all the diagrams are schematic.

DETAILED DESCRIPTION

Reference will now be made to the drawings to describe various inventive embodiments of the present disclosure in detail, wherein like numerals refer to like elements throughout.

Figure 1:
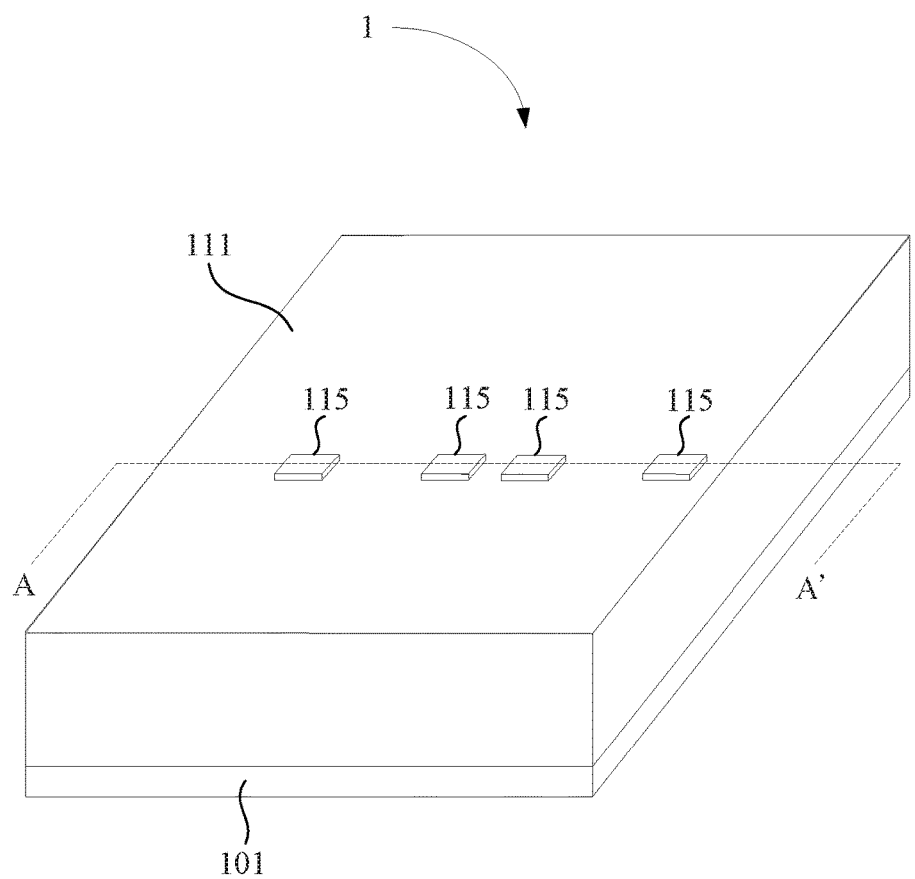
FIG. 1 is a schematic diagram showing a substrate structure according to the first embodiment of the present invention.
Figure 2:
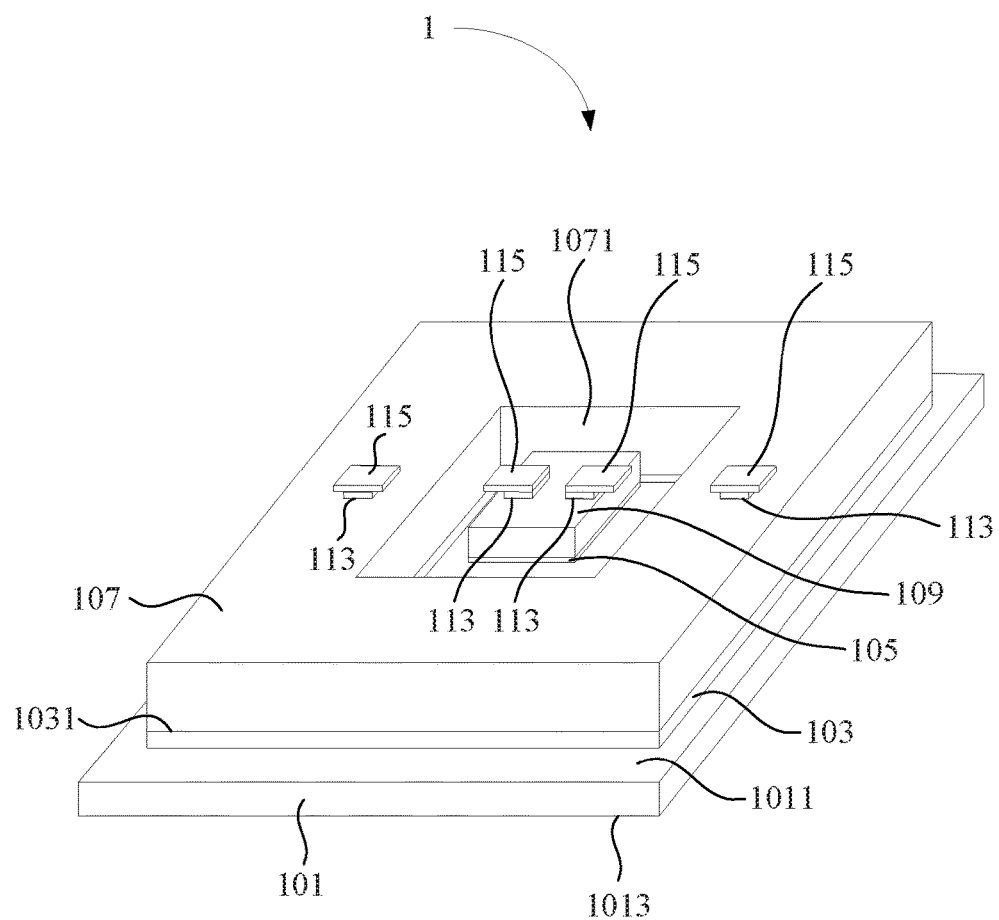
FIG. 2 is a schematic diagram showing a part of the substrate structure according to the first embodiment of the present invention.
Figure 3:
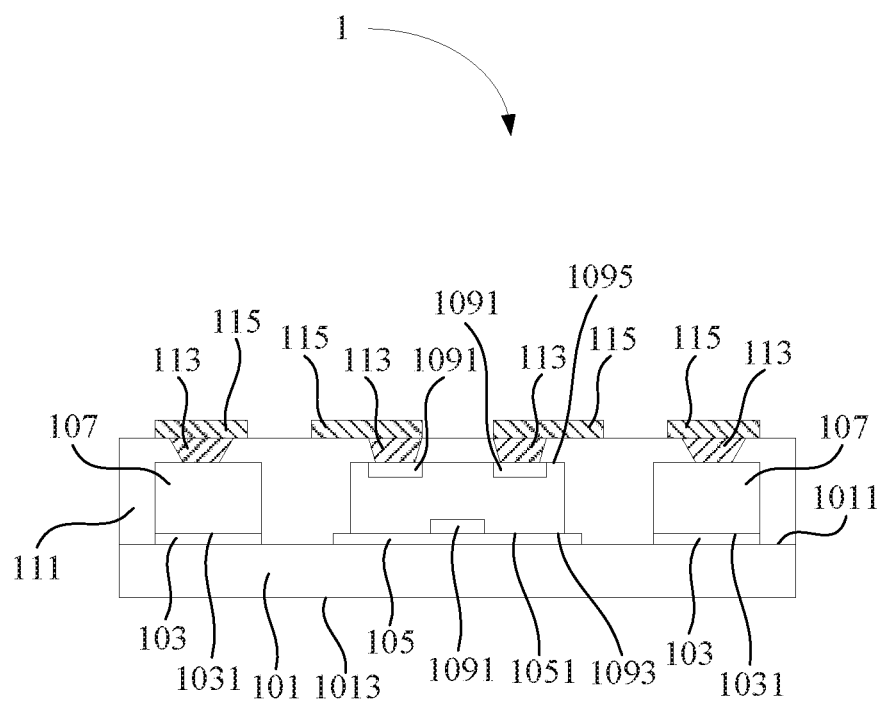
FIG. 3 is a sectional view of A-A' line of the FIG. 1.

FIG. 1, FIG. 2 and FIG. 3 depict a first embodiment of the present invention. FIG. 1 is a schematic diagram of a substrate structure 1 and FIG. 2 is a schematic diagram of a part of substrate structure 1. FIG. 3 is a sectional diagram of A-A' line of FIG. 1. The substrate structure 1 comprises a metal substrate 101, a first connection layer 103, a second connection layer 105, a metal core layer 107, an internal component 109, a dielectric material layer 111, a conductive pillar layer 113 and a conductive wiring layer 115. The metal substrate 101 has a first surface 1011 and a second surface 1013. The first connection layer 103 has a surface 1031. The second connection layer 105 has a surface 1051. The metal core layer 107 has an opening 1071. The internal component 109 has a plurality of electrode pads 1091, a first surface 1093 and a second surface 1095.

The metal core layer 107 is for electrical conductivity and provides characteristics of rigidity and heat dissipation. The materials are selected from cooper, nickel, stainless steel or a combination thereof, preferably selected from stainless steel or Ni—Cu alloy on the surface of stainless steel.

The dielectric material layer 111 is an organic resin without glass fiber or a molding compound layer, which has novolac-based resin, epoxy-based resin, silicone-based resin or other suitable molding compound. In the embodiment, the material of the dielectric material layer 111 is molding compound, which has characteristics of higher heat dissipation and lower expansion coefficient. The materials of metal substrate 101 are selected from aluminum, copper, nickel, stainless steel or a combination thereof. In the embodiment, the internal component 109 has three electrode pads 1091. More specifically, one of the electrode pads 1091 is disposed on the first surface 1093 of the internal component 109, and two of the electrode pads 1091 are disposed on the second surface 1095 of the internal component 109. However, in the other embodiments, the internal component could have any number of the electrode pads, and the electrode pads could be disposed on either the first surface 1011 or the second surface 1013 of the metal substrate 101. The shape of the electrode pads may be circular, rectangle, L-shaped or polygon. Similarly, in the present embodiment, the conductive pillar layer 113 has four conductive pillars. In the other embodiments, the conductive pillar layer 113 could have any number of the conductive pillars according to the function and the type of the substrate structure 1. The shape of the conductive pillars may be circular, rectangle, L-shaped or polygon.

The first connection layer 103 is disposed on the first surface 1011 of the metal substrate 101. The second connection 105 is disposed on the first surface 1011 of the metal substrate 101 and located in the opening 1071 of the metal core layer 107. The materials of the first connection layer 103 and the second connection layer 105 have characteristics of electrical conductivity and thermal conductivity, which may be copper, silver, nickel or a combination thereof. The metal core layer 107 is disposed on the surface 1031 of the first connection layer 103. The internal component 109 is located in the opening 1071 of the metal core layer 107 and disposed on the surface 1051 of the second connection layer 105. The conductive pillar layer 113 is disposed on the metal core layer 107 and on the electrode pad 1091, which is disposed on the second surface 1095 of the internal component 109. The dielectric material layer 111 is disposed on the first surface 1011 of the metal substrate 101 so as to partially cover the first connection layer 103, the metal core layer 107, the second connection layer 105, the internal component 109 and the conductive pillar layer 113. The conductive wiring layer 115 is disposed on the dielectric material layer 111 and on the conductive pillar layer 113.

To be noted, the first connection layer 103 may be disposed on the first surface 1011 of the metal substrate 101 partly or entirely. In other words, the first connection layer 103 could be patterned by photo lithography process or laser etching process.

The metal core layer 107 may be electrically connected to one of the electrode pads 1091 via the first connection layer 103, metal substrate 101 and the second connection layer 105. More detailed, the metal core layer 107 is electrically connected to one of the electrode pads 1091, which is disposed on the first surface 1093 of the internal component 109, via the first connection layer 103, the metal substrate 101 and the second connection layer 105. In addition, the conductive wiring layer 115 is electrically connected to the metal core layer 107 and the electrode pad 1091, which is disposed on the second surface 1095 of the internal component 109, via the conductive pillar layer 113.

To be noted, the metal core layer 107 may be formed by a plurality of independent metal blocks. The independent metal block could be an electrode individually, a source, a drain, a gate, an emitter, a base or a collector of a semiconductor. In addition, the metal core layer 107 may be a plate, which has a flat surface without patterned.

In other embodiment, the layers (e.g., dielectric material layer, conductive pillar layer or metal connection layer) or the electric components could be disposed on the conductive wiring layer 115.

Figure 4:
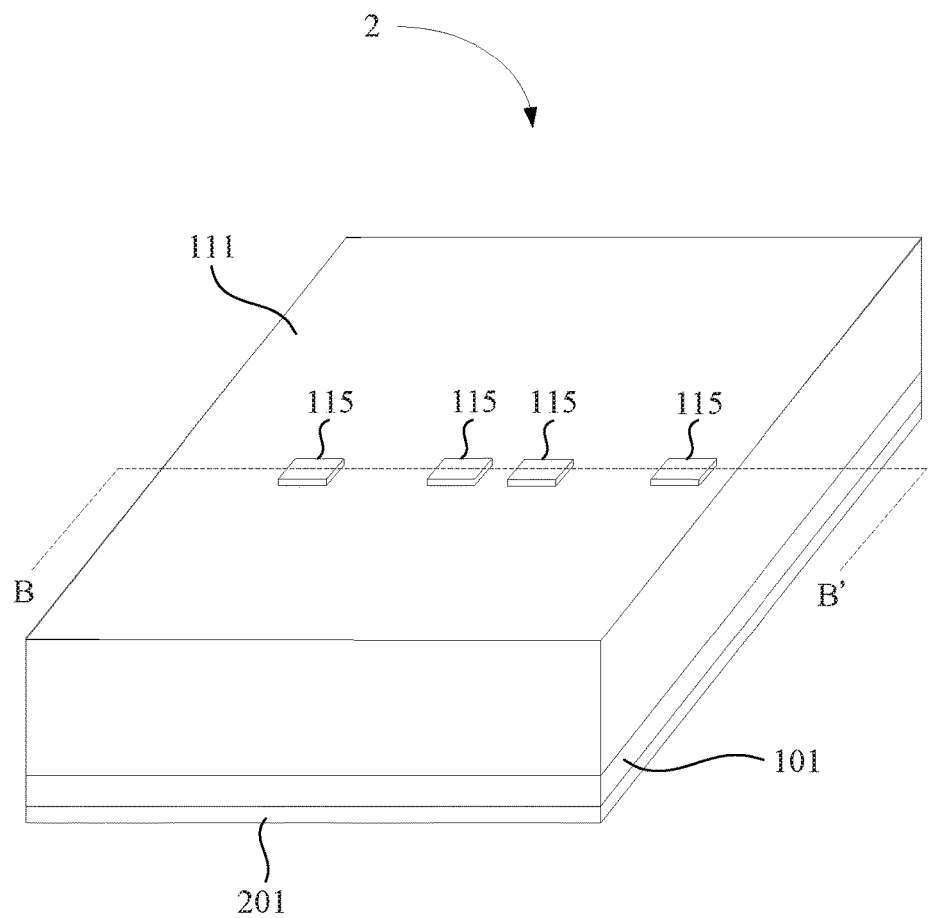
FIG. 4 is a schematic diagram showing view of a substrate structure according to the second embodiment of the present invention.
Figure 5:
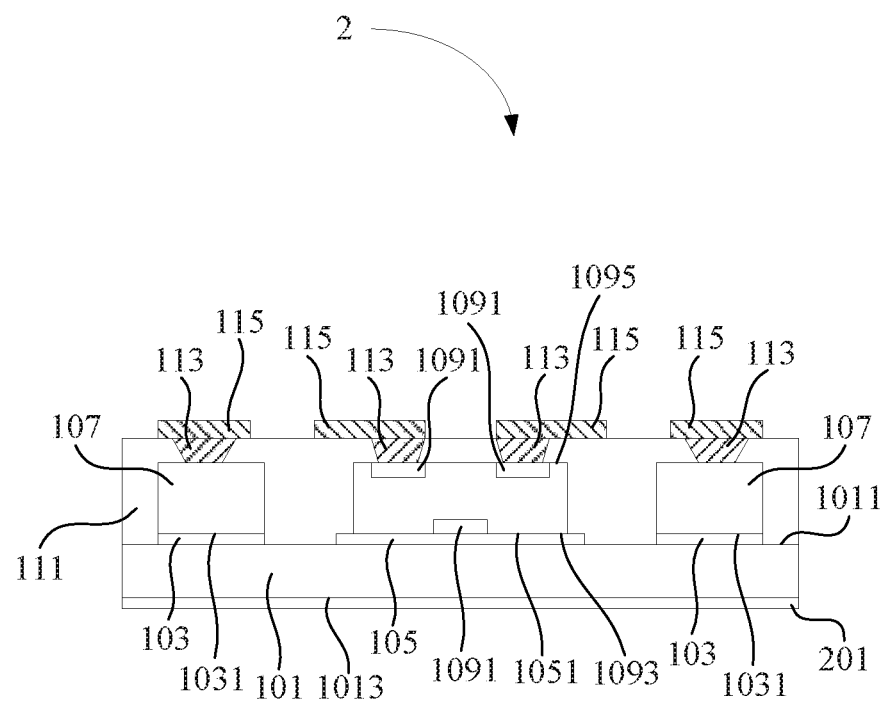
FIG. 5 is a sectional view of B-B' line of the FIG. 4.

FIG. 4 and FIG. 5 are showing a substrate structure 2 according to the second embodiment of the present invention. The substrate structure 2 is similar to the substrate structure 1 of the first embodiment, wherein the substrate structure 2 further comprises a thermal conductive insulation layer 201, which is disposed on the second surface 1013 of the metal substrate 101.

Figure 6:
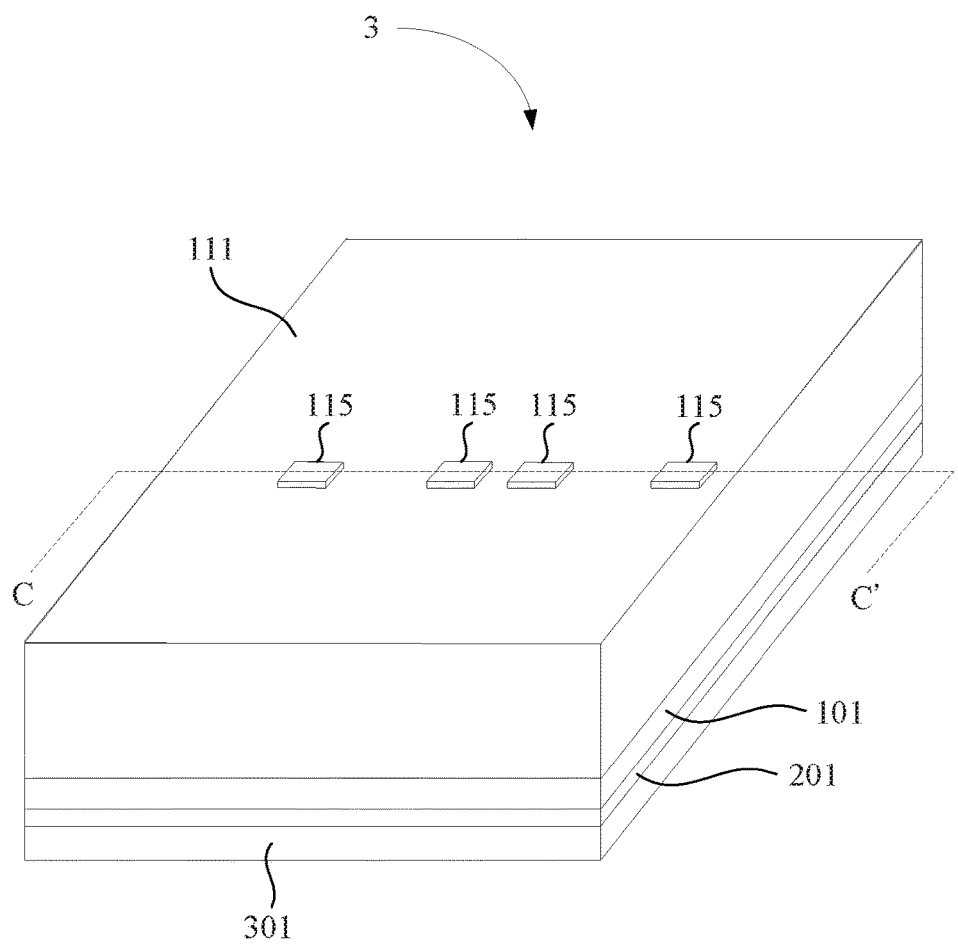
FIG. 6 is a schematic diagram showing view of a substrate structure according to the third embodiment the present invention.
Figure 7:
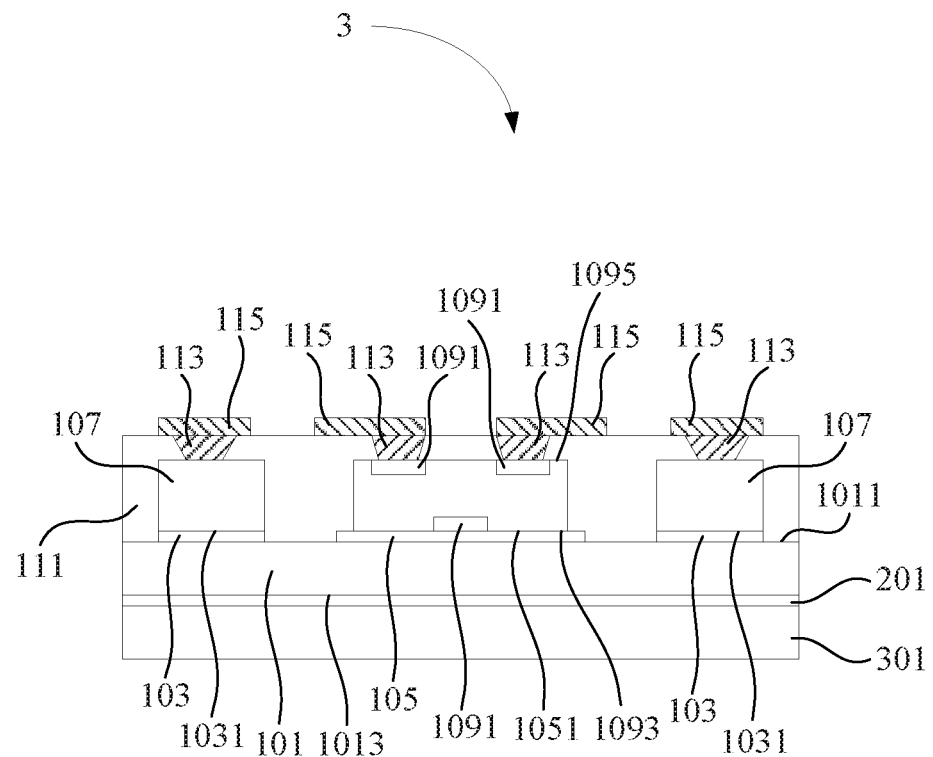
FIG. 7 is a sectional view of C-C' line of the FIG. 6.

FIG. 6 and FIG. 7 are showing a substrate structure 3 according to the third embodiment of the present invention. The substrate structure 3 is similar to the substrate structure 2 of the second embodiment in the present invention. In the third embodiment, the substrate structure 3 further comprises a thermal conductive insulation layer 201, which is disposed on a thermal conductive plate 301.

Figure 8:
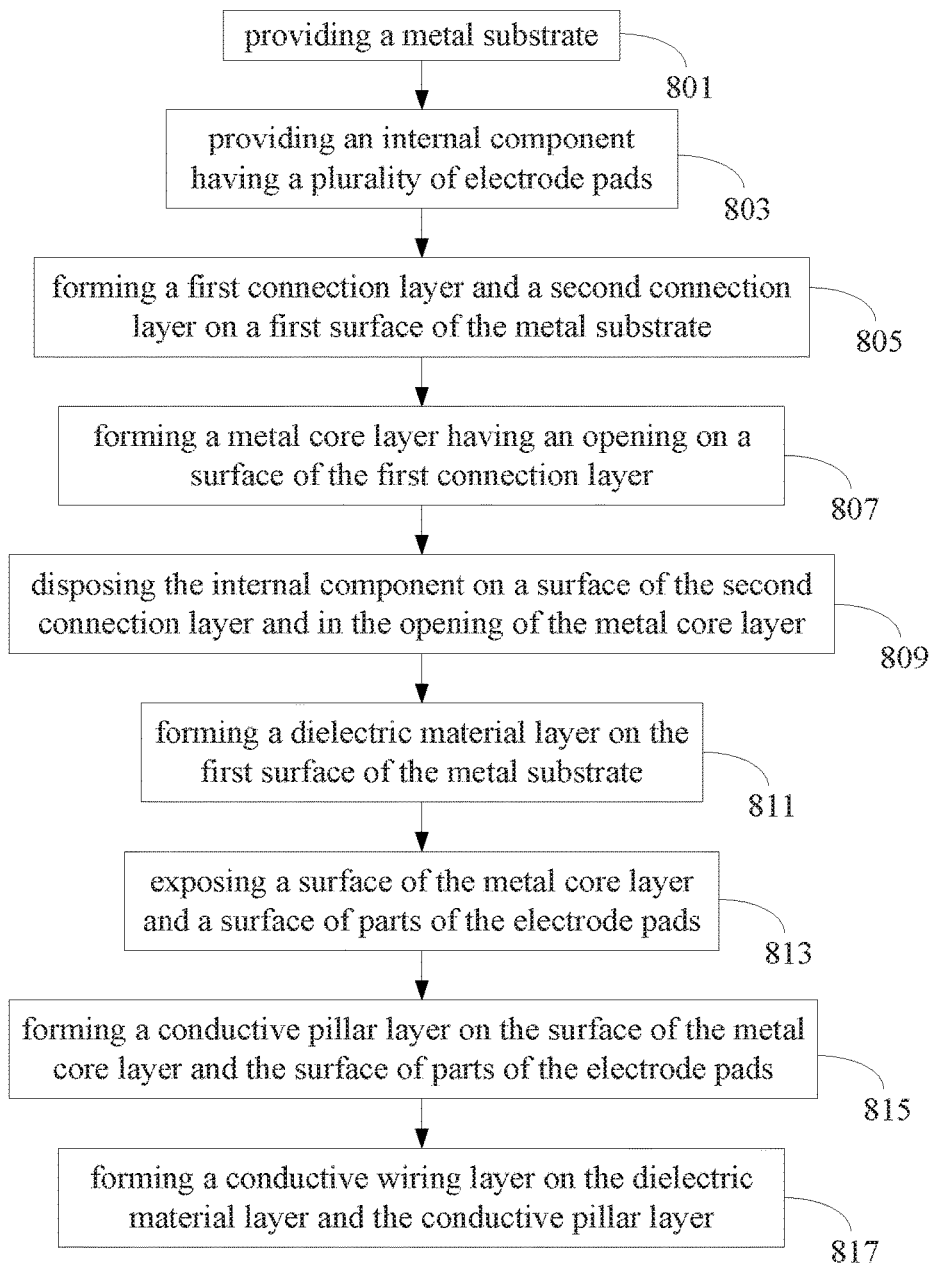
FIG. 8 is a flow chart showing a manufacturing method of a substrate structure according to the fourth embodiment of the present invention.

FIG. 8 is a flow chart showing a manufacturing method of a substrate structure according to the fourth embodiment of the present invention. In this embodiment, the manufacturing method may be utilized to make the substrate structure 1 of the first embodiment.

Figure 9A:
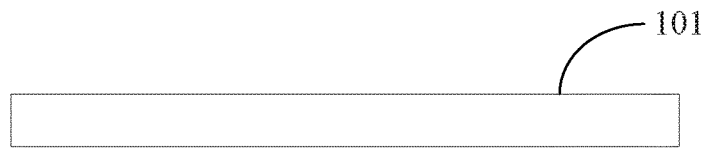
FIGS. 9A-9G are schematic diagrams showing the manufacturing method of the substrate structure according to FIG. 8.

Referring to FIG. 8 and FIG. 9A, step 801 is executed to provide a metal substrate 101. The materials of the metal substrate 101 are selected from aluminum, copper, nickel, stainless steel or a combination thereof. Step 803 is executed to provide an internal component having a plurality of electrode pads. (Not shown in figured)

Figure 9B:
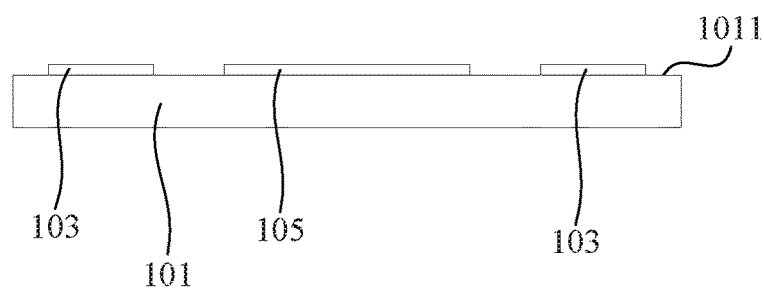

Referring to FIG. 8 and FIG. 9B, step 805 is executed to form a first connection layer 103 and a second connection layer 105 on a first surface 1011 of the metal substrate 101.

Figure 9C:
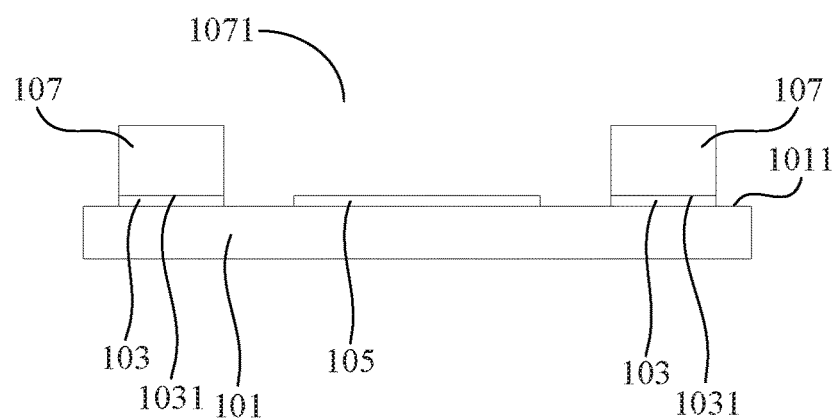

Referring to FIG. 8 and FIG. 9C, step 807 is executed to form a metal core layer 107 having an opening 1071 on a surface 1031 of the first connection layer 103.

Figure 9D:
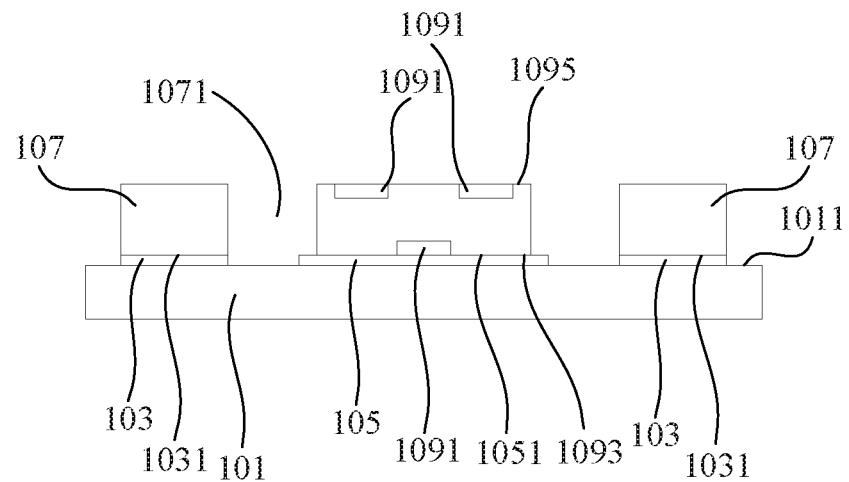

Referring to FIG. 8 and FIG. 9D, step 809 is executed to dispose the internal component 109 on a surface 1051 of the second connection layer 105 and in the opening 1071 of the metal core layer 107.

Figure 9E:
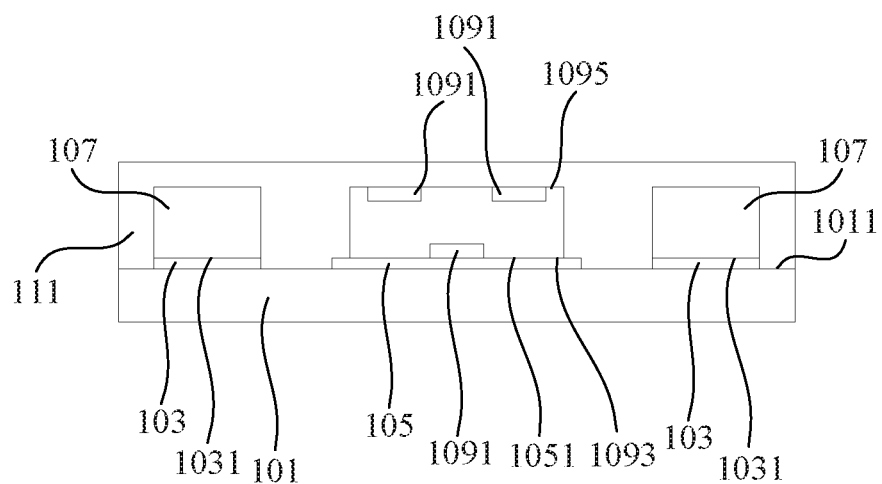

Referring to FIG. 8 and FIG. 9E, step 811 is executed to form a dielectric material layer 111 on the first surface 1011 of the metal substrate 101. The dielectric material layer 111 is partially covering the first connection layer 103, the metal core layer 107, the second connection layer 105 and the internal component 109.

Figure 9F:
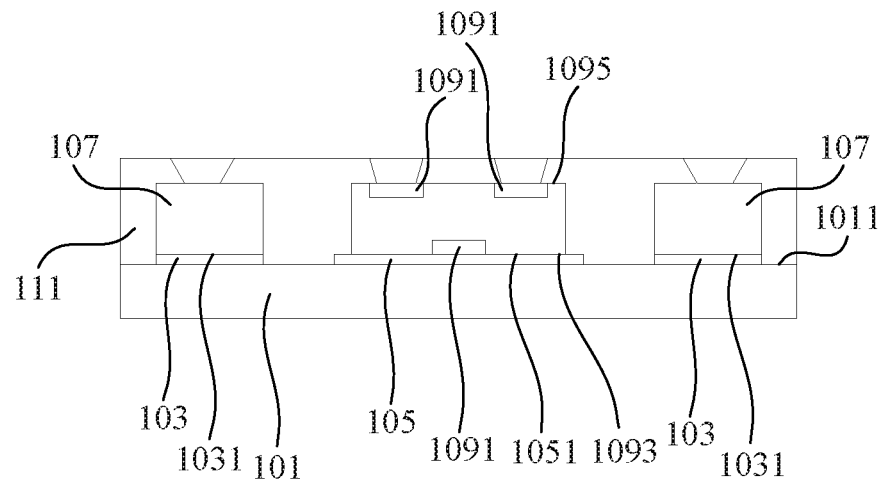

Referring to FIG. 8 and FIG. 9F, step 813 is executed to expose a surface of the metal core layer 107 and a surface of parts of the electrode pads 1091.

Figure 9G:
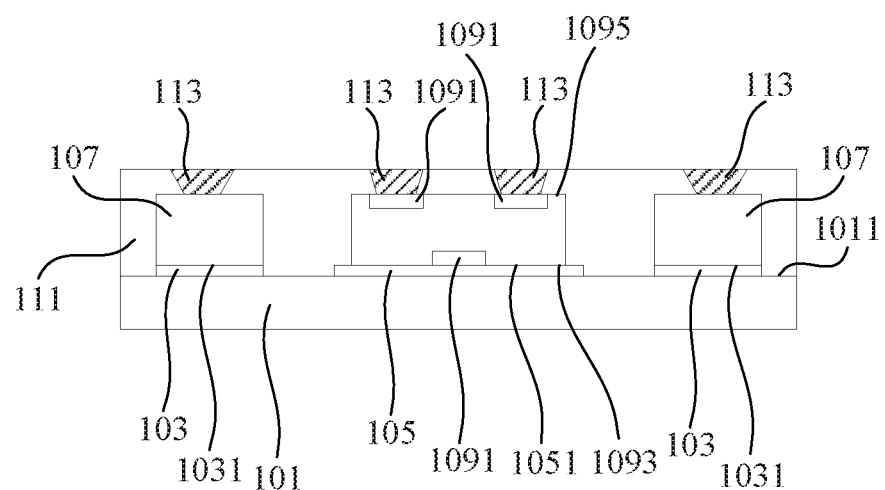

Referring to FIG. 8 and FIG. 9G; step 815 is executed to form a conductive pillar layer 113 on the surface of the metal core layer 107 and the surface of parts of the electrode pads 1091.

Referring to FIG. 8, step 817 is executed to form a conductive wiring layer 115 on the dielectric material layer 111 and the conductive pillar layer 113 so as to form the substrate structure 1 as shown in FIG. 3.

Figure 10:
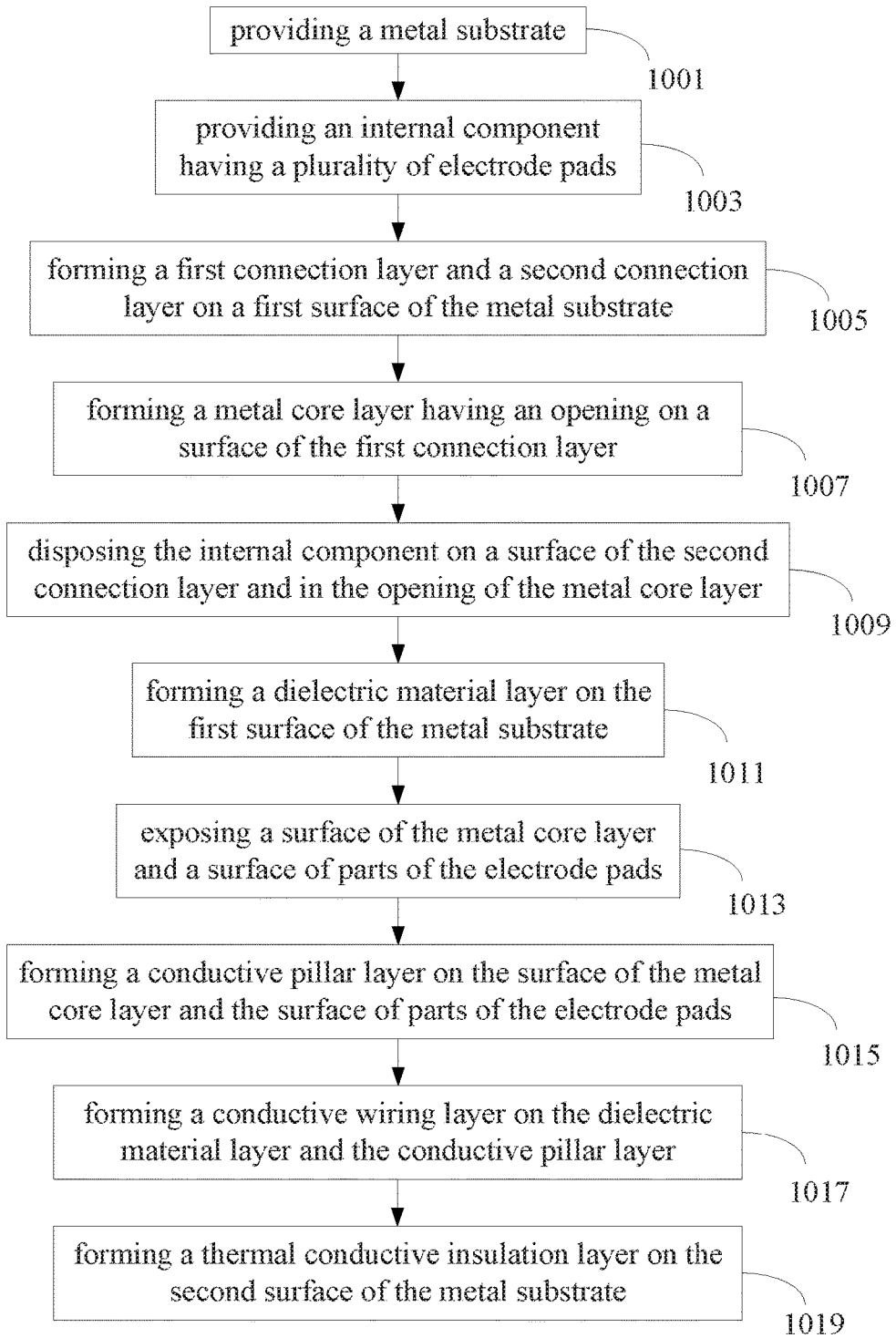
FIG. 10 is a flow chart showing a manufacturing method of a substrate structure according to the fifth embodiment of the present invention.

FIG. 10 is a flow chart showing a manufacturing method of a substrate structure according to the fifth embodiment of the present invention. In this embodiment, the manufacturing method may be utilized to make the substrate structure 2 of the second embodiment. In the embodiment, step 1001 to step 1017 is similar to step 801 to step 817.

Referring to FIG. 10, step 1019 is executed to form a thermal conductive insulation layer 201 on the second surface 1013 of the metal substrate 101 so as to form the substrate structure 2 as shown in FIG. 5.

Figure 11:
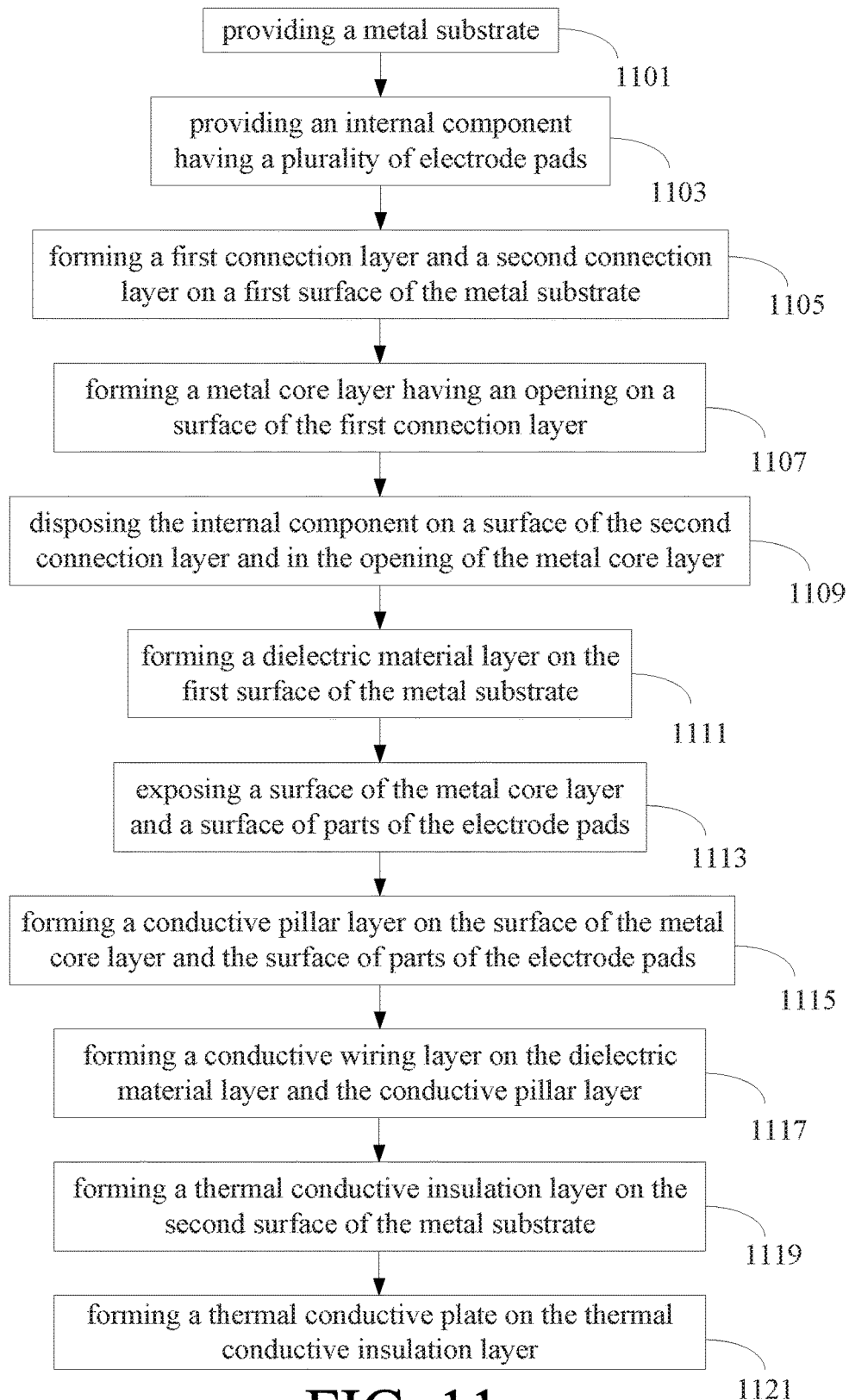
FIG. 11 is a flow chart showing a manufacturing method of a substrate structure according to the sixth embodiment of the present invention.

FIG. 11 is a flow chart showing a manufacturing method of a substrate structure according to the sixth embodiment of the present invention. In this embodiment, the manufacturing method may be utilized to make the substrate structure 3 of the third embodiment. In the embodiment, step 1101 to step 1119 is similar to step 1001 to step 1019.

Referring to FIG. 11, step 1121 is executed to form a thermal conductive plate 301 on the thermal conductive insulation layer 201 so as to form the substrate structure 3 as shown in FIG. 7.

Figure 12:
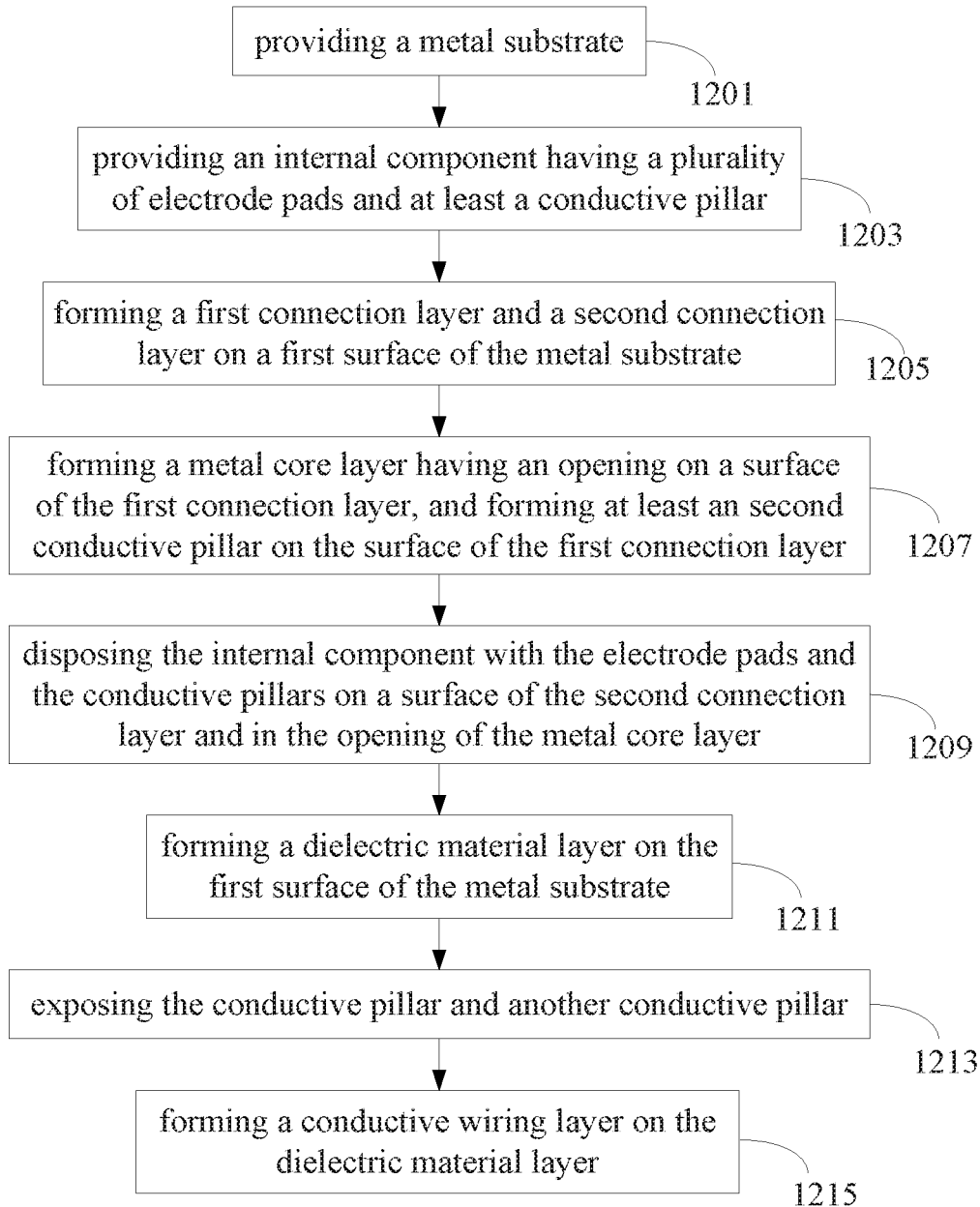
FIG. 12 is a flow chart showing a manufacturing method of a substrate structure according to the seventh embodiment of the present invention

FIG. 12 is a flow chart showing a manufacturing method of a substrate structure according to the seventh embodiment of the present invention. In this embodiment, the manufacturing method may be utilized to make the substrate structure 1 of the first embodiment.

Figure 13A:
FIGS. 13A-13F are schematic diagrams showing the manufacturing method of the substrate structure according to FIG. 12.

Referring to FIG. 12 and FIG. 13A, step 1201 is executed to provide a metal substrate 101. Wherein, the materials of the metal substrate 101 are selected from aluminum, copper, nickel, stainless steel or a combination thereof. Step 1203 is executed to provide an internal component having a plurality of electrode pads and at least a conductive pillar. (Not shown in figure)

Figure 13B:
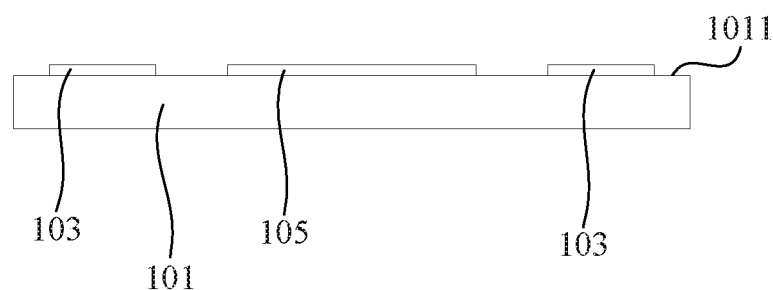

Referring to FIG. 12 and FIG. 13B, step 1205 is executed to form a first connection layer 103 and a second connection layer 105 on a first surface 1011 of the metal substrate 101.

Figure 13C:
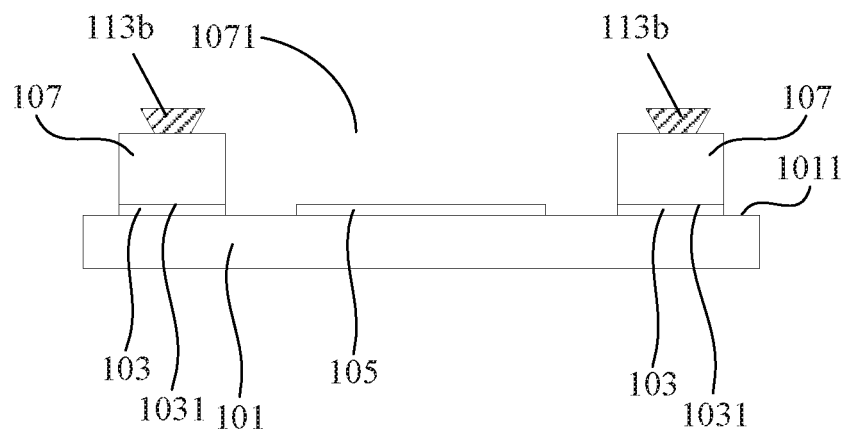

Referring to FIG. 12 and FIG. 13C, step 1207 is executed to form a metal core layer 107, which has an opening 1071, on a surface 1031 of the first connection layer 103, and to form at least one second conductive pillar 113b on a surface, which is away from the surface 1031 of the first connection layer 103, of the metal core layer 107. In other words, the second conductive pillar 113b is formed on the surface of the metal core layer 107 that is opposite to a surface of the metal core layer 107 contacted to the surface 1031 of the first connection layer 103.

Figure 13D:
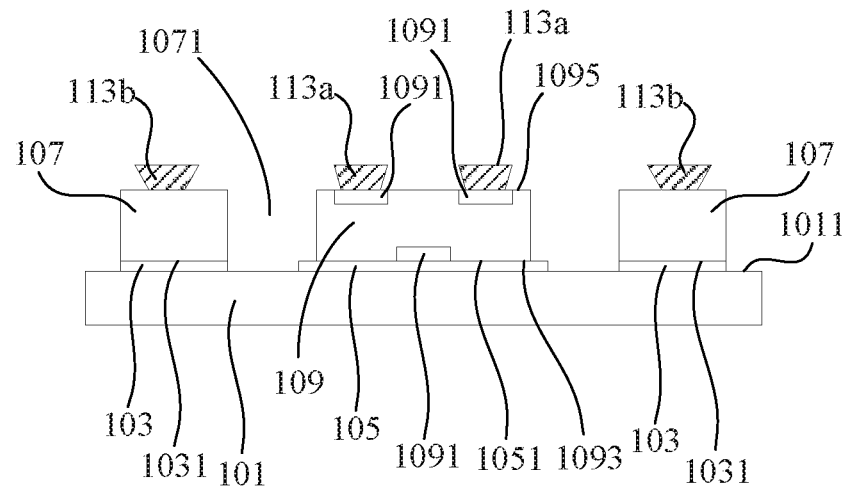

Referring to FIG. 12 and FIG. 13D, step 1209 is executed to dispose the internal component 109 with the electrode pads 1091 and the conductive pillars 113a on a surface 1051 of the second connection layer 105 and in the opening 1071 of the metal core layer 107. In the present embodiment, the conductive pillar 113a and the conductive pillar 113b consist of the conductive pillar layer 113 of the first embodiment, and the conductive pillar layer can be made by method of electroplating or non-electroplating.

Figure 13E:
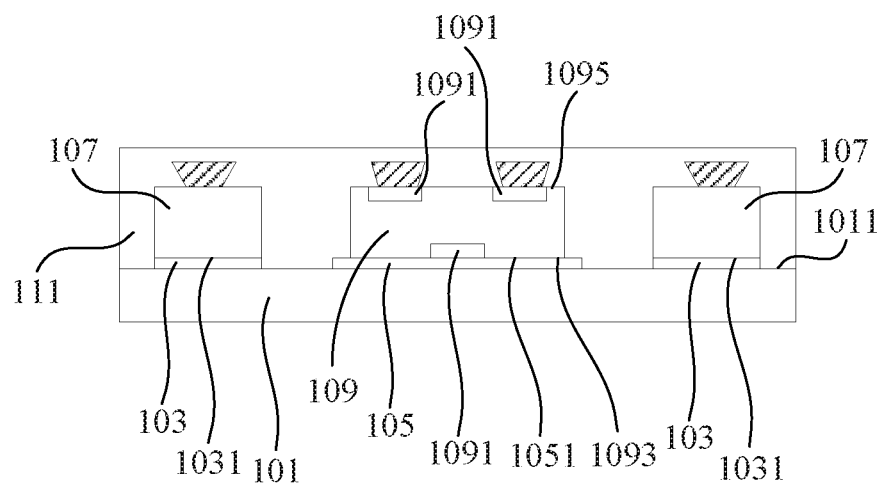

Referring to FIG. 12 and FIG. 13E, step 1211 is executed to form a dielectric material layer 111 on the first surface 1011 of the metal substrate 101, and to partially cover the first connection layer 103, the metal core layer 107, the second connection layer 105 and the internal component 109. In the embodiment, the height of the conductive pillar 113a and the height of the conductive pillar 113b may not equal to each other.

Figure 13F:
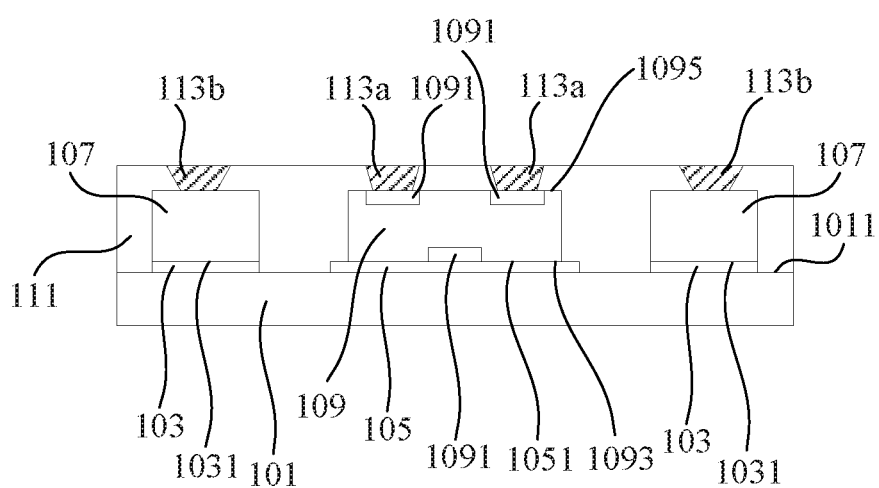

Referring to FIG. 12 and FIG. 13F, step 1213 is executed to expose the conductive pillar 113a and the conductive pillar 113b, which are formed on the surface of the metal core layer 107 and the electrode pads 1091. In the embodiment, the conductive pillar 113a and the conductive pillar 113b are exposed after milling the dielectric material layer 111.

Referring to FIG. 12, step 1215 is executed to form a conductive wiring layer 115 on the dielectric material layer 111, the conductive pillar 113a and the conductive pillar 113b of the conductive pillar layer so as to form the substrate structure 1 as shown in FIG. 3.

Figure 14:
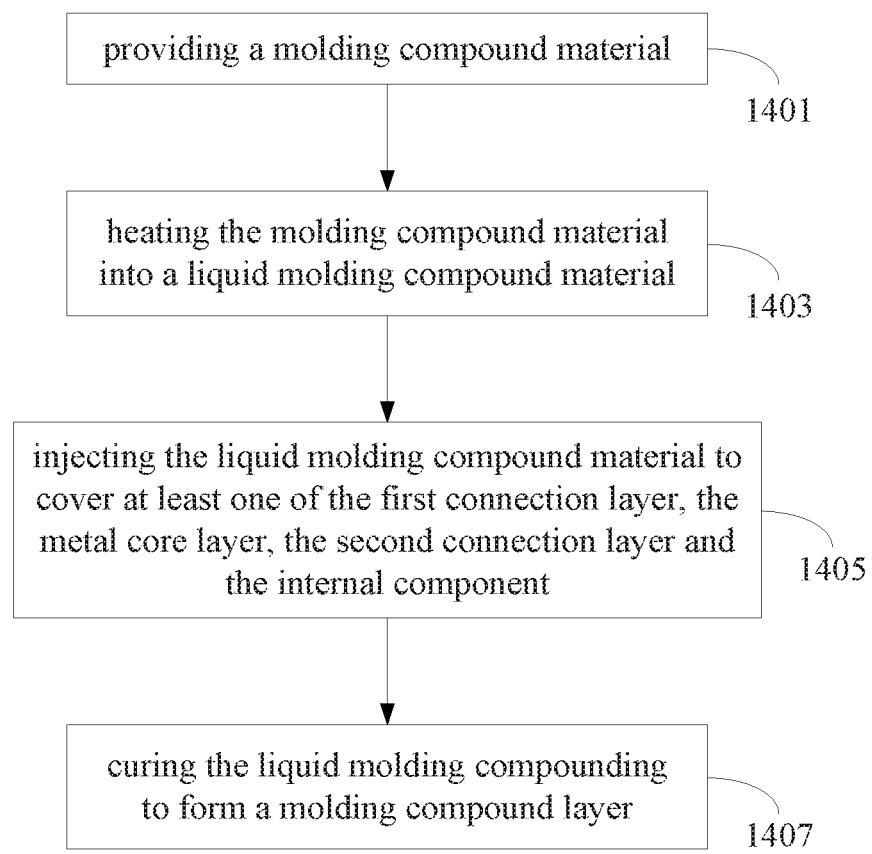
FIG. 14 is a flow chart of forming a dielectric material layer.
Figure 15A:
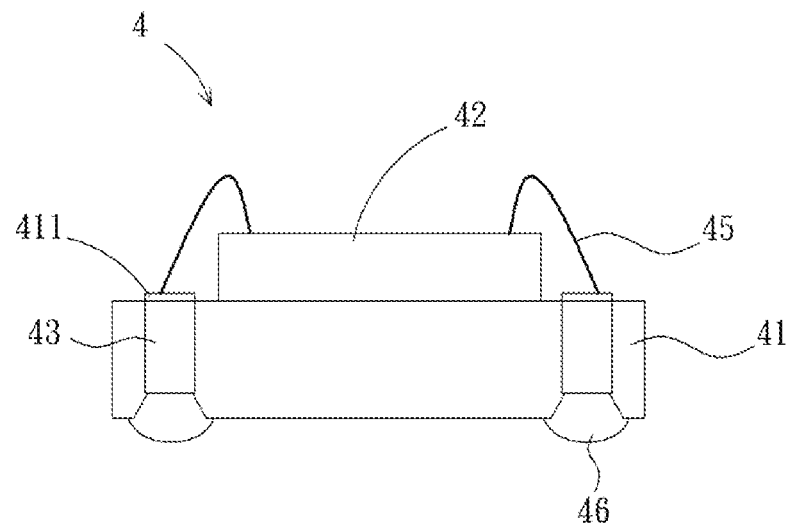
FIGS. 15A-15B are schematic diagrams showing the conventional package structure.
Figure 15B:
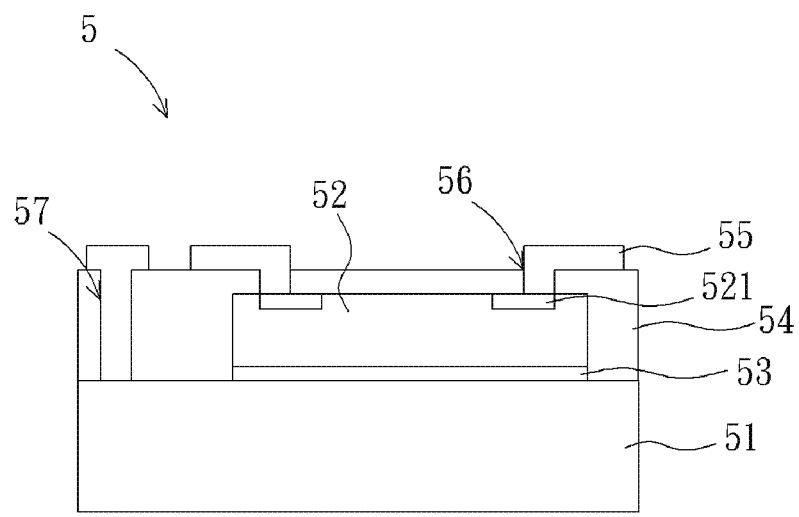

Additionally, steps 811, 1011, 1111 and 1211 for forming the dielectric material layer further includes the following steps. As shown in FIG. 14, step 1401 is providing a molding compound material. Step 1403 is heating the molding compound material into a liquid molding compound material. Step 1405 is injecting the liquid molding compound material to cover at least one of the first connection layer 103, the metal core layer 107, the second connection layer 105 and the internal component 109. Step 1407 is curing the liquid molding compounding to form a molding compound layer. In other words, the molding compound layer is the dielectric component layer 111.

As mentioned above, the substrate structure and its manufacturing method of the present invention utilizes the metal substrate to replace the conventional fiberglass substrate to improve the structure rigidity. In addition, the metal substrate may provide the advantage of good conductivity, high thermal efficiency and EMI protection. Moreover, the metal core layer and the conductive pillar layer also can improve the structure rigidity. Furthermore, the manufacturing method of the substrate structure abandons to use the method of laser drilling and the mechanical drilling so as to reduce the labor hour and the cost. Therefore, the substrate structure and its manufacturing method of the present invention that has the advantage of higher rigidity, higher heat dissipation and meeting the fine line spacing, high-density, thinning tendency, low cost and high electric characteristics.

Even though numerous characteristics and advantages of certain inventive embodiments have been set out in the foregoing description, together with details of the structures and functions of the embodiments, the disclosure is illustrative only. Changes may be made in detail, especially in matters of arrangement of parts, within the principles of the present disclosure to the full extent indicated by the broad general meaning of the terms in which the appended claims are expressed.

What is claimed is:

1. A substrate structure, comprising:
   a metal substrate;
   a first connection layer that is disposed on a part of a first surface of the metal substrate;
   a metal core layer having an opening that is disposed on a surface of the first connection layer;
   a second connection layer that is located in the opening of the metal core layer and disposed on a part of the first surface of the metal substrate;
   an internal component having a plurality of electrode pads that is located in the opening of the metal core layer and disposed on the second connection layer; and
   a dielectric material layer that is covering a part of the first connection layer, the second connection layer, the metal core layer and the internal component;
   wherein the metal core layer is electrically connected to one of the electrode pads via the metal substrate, the first connection layer and the second connection layer.

2. The substrate structure defined in claim 1, wherein the electrode pads are disposed on a first surface and a second surface of the internal component respectively, and the metal core layer is electrically connected to at least one of the electrode pads, which is disposed on the first surface of the internal component, via the metal substrate, the first connection layer and the second connection layer.

3. The substrate structure defined in claim 2, further comprising:
   a conductive pillar layer that is disposed on the metal core layer and the electrode pads, which are disposed on the second surface of the internal component, and partially covered by the dielectric material layer.

4. The substrate structure defined in claim 3, wherein the conductive pillar layer has a plurality of conductive pillars, which are in shapes of cylindrical, triangular prism, rectangular prism or irregular prism respectively.

5. The substrate structure defined in claim 3, further comprising:
   a conductive wiring layer that is disposed on the dielectric material layer and the conductive pillar layer, and electrically connected to the metal core layer and the electrode pads, which are disposed on the second surface of the internal component, via the conductive pillar layer.

6. The substrate structure defined in claim 1, wherein the dielectric material layer is a molding compound layer having one of novolac-based resin, epoxy-based resin, and silicone-based resin.

7. The substrate structure defined in claim 1, wherein the metal core layer has materials selected from copper, nickel, stainless steel or a combination thereof.

8. The substrate structure defined in claim 1, wherein the metal core layer is an integrated metal core layer or a patterned metal core layer.

9. The substrate structure defined in claim 1, further comprising:
   a thermal conductive insulation layer that is disposed on a second surface of the metal substrate.

10. A manufacturing method of a substrate structure, comprising the following steps of:
    providing a metal substrate;
    providing an internal component having a plurality of electrode pads;
    forming a first connection layer and a second connection layer on a first surface of the metal substrate;
    forming a metal core layer having an opening on the first connection layer;
    disposing the internal component in the opening and on the second connection layer;
    forming a dielectric material layer on the first surface of the metal substrate so as to partially cover the first connection layer, the metal core layer, the second connection layer and the internal component; and
    exposing a surface of the metal core layer and a surface of parts of the electrode pads.

11. The manufacturing method defined in 10, further comprising the following step of:
    forming a conductive pillar layer on the surface of the metal core layer and on the surface of the electrode pads.

12. The manufacturing method defined in 11, further comprising the following step of:
    forming a conductive wiring layer on the dielectric material layer and the conductive pillar layer.

13. The manufacturing method defined in 10, further comprising the following step of:
    forming a thermal conductive insulation layer on a second surface of the metal substrate.

14. A manufacturing method of a substrate structure, comprising the following steps of:
    providing a metal substrate;
    providing an internal component having a plurality of electrode pads;
    forming at least a conductive pillar on the electrode pads;

forming a first connection layer and a second connection layer on a first surface of the metal substrate;

forming a metal core layer having an opening on the first connection layer;

forming at least one second conductive pillar on a surface of the metal core layer that is opposite to a surface of the metal core layer contacted to the surface of the first connection layer;

disposing the internal component in the opening and on the second connection layer;

forming a dielectric material layer to cover the first connection layer, the metal core layer, the second connection layer, the internal component, the conductive pillar and the second conductive pillar; and exposing the second conductive pillar on the metal core layer and the conductive pillar on the electrode pads.

15. The manufacturing method defined in claim 14, wherein the conductive pillar and the second conductive pillar are exposed after milling the dielectric material layer.

16. The manufacturing method defined in claim 14, further comprising the following step of:

forming a conductive wiring layer on the dielectric material layer, the conductive pillar and the second conductive pillar.

17. The manufacturing method defined in claim 14, further comprising the following step of:

forming a thermal conductive insulation layer on a second surface of the metal substrate.

* * * * *